(12) United States Patent
Morishima

(10) Patent No.: US 6,310,795 B1
(45) Date of Patent: Oct. 30, 2001

(54) SEMICONDUCTOR MEMORY DEVICE WITH DATA RETENTION CHARACTERISTIC OF IMPROVED STABILITY

(75) Inventor: Chikayoshi Morishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/584,088

(22) Filed: May 31, 2000

(30) Foreign Application Priority Data

Dec. 6, 1999 (JP) .................................................. 11-346198

(51) Int. Cl.$^7$ ...................................................... G11C 5/06
(52) U.S. Cl. ......................................... 365/63; 365/230.03
(58) Field of Search ................................. 365/63, 230.03, 365/233, 754

(56) References Cited

U.S. PATENT DOCUMENTS 5,708,599 * 1/1998 Sato et al. .............................. 365/154
5,959,930 * 9/1999 Sakurai ............................ 365/230.03

FOREIGN PATENT DOCUMENTS

| 58-6586 | 1/1983 | (JP) . |
| 5-217388 | 8/1993 | (JP) . |
| 7-45077 | 2/1995 | (JP) . |

* cited by examiner

*Primary Examiner*—David Nelms
*Assistant Examiner*—M. Tran
(74) *Attorney, Agent, or Firm*—McDermott, Will & Emery

(57) ABSTRACT

During standby, bit lines BL1 and /BL1 are precharged, and the potentials of word lines WL1 and WL2 are set at a potential slightly higher than a ground potential. Since a stable retaining current flows through an access transistor into a node inside a memory cell holding the H level, the data can be retained with stability. Moreover, during an access, the selected word line is brought to the H level, while the unselected word lines are brought to a ground potential.

14 Claims, 13 Drawing Sheets

US 6,310,795 B1

SEMICONDUCTOR MEMORY DEVICE WITH DATA RETENTION CHARACTERISTIC OF IMPROVED STABILITY

BACKGROUND OF THE INVENTION

1. Field of the Invention

The present invention relates to a semiconductor memory device, and more specifically, to a static semiconductor memory device not requiring a refresh operation.

2. Description of the Background Art

Along with technological advances, electrical equipments are expected to handle more and more information. Accordingly, a semiconductor memory device of a greater capacity is required.

Since one bit of memory cell can be formed by two circuit elements in a dynamic random access memory (DRAM), a DRAM is most suitable for implementing a large capacity semiconductor memory device. On the other hand, a static random access memory (SRAM) excels the DRAM in speed and in power consumption, and is easy to use since no refresh operation is required. As a result, an SRAM is frequently used in a field where performance is a priority, or in a small-scale memory system in which a complex control is not performed. An SRAM normally requires six elements for one bit of memory cell.

In the case of a high-resistance-load cell, four MOS transistors and two high resistance elements form one bit of memory cell.

The large number of elements required per one bit put the SRAM at a great disadvantage in implementing a large capacity semiconductor memory device when compared with a DRAM, however.

To compensate for this disadvantage, an SRAM is proposed in which, instead of providing a high resistance element for data retention, a bit line is precharged and the leakage current flowing through an access transistor is used to retain the data.

FIG. 14 is a block diagram representing the configuration of a conventional semiconductor memory device 501.

As shown in FIG. 14, semiconductor memory device 501 includes a memory array MA containing memory cells M11, M21, M31, and M41 arranged in a matrix of rows and columns, a word line WL1 for selecting memory cells M11 and M21, a word line WL2 for selecting memory cells M31 and M41, bit lines BL1 and /BL1 provided corresponding to memory cells M11 and M31, bit lines BL2 and /BL2 provided corresponding to memory cells M21 and M41, and a precharging circuit 510 for precharging bit lines BL1, /BL1, BL2, and /BL2 according to a clock signal T.

Semiconductor memory device 501 further includes a row decode circuit 504 for activating word lines WL1 and WL2 according to clock signal T and a row address signal X, a column decode circuit 506 for outputting column select signals DY1 and DY2 according to clock signal T and a column address signal Y, a transfer gate circuit 511 for connecting one of bit lines BL1 and BL2 to a data line DL and one of bit lines /BL1 and /BL2 to a data line /DL according to column select signals DY1 and DY2, and a read/write circuit 508 for writing an input/output data signal DQ into a memory cell according to a write control signal WE during a data write operation and for outputting data read from a memory cell as input/output data signal DQ during a data read operation.

Here, a memory cell array including memory cells arranged in two rows and two columns is shown for simplicity. In practice, a memory cell array includes a greater number of memory cells arranged in a matrix of rows and columns.

FIG. 15 is a circuit diagram showing the configuration of memory cells M11 and M31 shown in FIG. 14.

As shown in FIG. 15, memory cell M11 includes an N-channel MOS transistor 572 connected between bit line BL1 and a node N15 and having, a gate connected to word line WL1, an N-channel MOS transistor 574 connected between bit line /BL1 and a node N16 and having a gate connected to word line WL1, an N-channel MOS transistor 576 connected between node N15 and a ground node and having a gate connected to node N16, and an N-channel MOS transistor 578 connected between node N16 and a ground node and having a gate connected to node N15.

N-channel MOS transistors 572 and 574 are referred to as access transistors, and N-channel MOS transistors 576 and 578 are referred to as driver transistors.

Memory cell M31 includes an N-channel MOS transistor 582 connected between bit line BL1 and a node N17 and having a gate connected to word line WTL2, an N-channel MOS transistor 584 connected between bit line /BL1 and a node N18 and having a gate connected to word line WL2, an N-channel MOS transistor 586 connected between node N17 and a ground node and having a gate connected to node N18, and an N-channel MOS transistor 588 connected between node N18 and a ground node and having a gate connected to node N17.

In memory cells M21 and M41 shown in FIG. 14, bit lines BL2 and /BL2 respectively replace bit lines BL1 and /BL1 in the configuration of memory cells M11 and M31 shown in FIG. 15. The internal configuration of memory cells M21 and M41 are the same as that of memory cells M11 and M31 so that the description thereof will not be repeated.

Now, the operation of a conventional semiconductor memory device will be described briefly below.

Referring to FIGS. 14 and 15, let us assume that memory cell M11 retains the data of the logic high or H Level as the potential of node N15 and that memory cell M31 retains the data of the logic low or L level as the potential of node N17.

While clock signal T is at the L level, all word lines WL1 and WL2 and column select signals DY1 and DY2 are at a ground potential so that none of the memory cells is selected.

At this time, P-channel MOS transistors 512 to 516 contained in precharging circuit 510 are rendered conductive, and bit lines BL1, /BL1, BL2, and /BL2 are respectively charged to a power-supply potential.

In addition, the H level data held by node N15 in memory cell M11 is retained by the leakage current from N-channel MOS transistor 572 which is an access transistor.

In other words, the potential of node N15 is determined based on the ratio of the respective resistance values of N-channel MOS transistors 572 and 576 both in the inactive state. If the potential of node N15 is higher than the threshold voltage of N-channel MOS transistor 578, node N16 attains the ground potential, and the data stored in memory cell M11 is retained.

When clock signal T attains the H level, the read operation begins, and word line WL1 and column select signal DY1 attains the H level. Consequently, memory cell M11 is selected.

When word line WL1 attains the H level, a current I1 flows in from bit line /BL1 into memory cell M11. On the other hand, from bit line BL1, a leakage current I2 flows in toward a ground node via N-channel MOS transistor 576 in the inactive state and a leakage current I3 flows into the unselected memory cell M31. The sum of these leakage currents is sufficiently smaller than the current that flows into memory cell M11 from bit line /BL1. Therefore, a potential difference is generated between bit lines BL1 and /BL1. This potential difference is amplified by read/write circuit 508 and is output to the outside as input/output data signal DQ.

When clock signal T once again attains the L level, the access to the memory cell is completed.

Once again, all word lines WL1 and WL2 and column select signals DY1 and DY2 attain the ground potential. Bit lines BL1, /BL1, BL2, and /BL2 are charged by precharging circuit 510, and the H level data held by node N15 in memory cell M11 is also charged by the leakage current from N-channel MOS transistor 572 which is an access transistor.

By precharging a bit line in order advantageously to utilize the leakage current from an access transistor for data retention, a memory cell of an SRAM can be configured with four elements. As a result, an SRAM of a larger capacity than that having a memory cell configured with six elements can be easily produced. In addition, since no refresh operation as required by a DRAM is necessary, an easy-to-use SRAM can be provided.

A conventionally proposed semiconductor memory device is configured in the above-described manner, where the H level data within memory cells are retained by the leakage currents of access transistors.

The leakage currents of access transistors have a significant characteristic variation, however. In other words, the leakage currents vary from one access transistor to another of, for instance, more than a million access transistors within one chip. If there is an access transistor whose leakage current is exceptionally large, the standby current would be increased. On the contrary, if there is an access transistor whose leakage current is exceptionally small, it would be impossible to retain the H level data.

Thus, the problem was that it was difficult to produce transistors whose values of leakage currents required for data retention are uniform.

SUMMARY OF THE INVENTION

The object of the present invention is to provide a semiconductor memory device having a small chip area and being capable of retaining data with stability.

In short, the present invention is a semiconductor memory device formed on a main surface of a semiconductor substrate and provided with a memory array, a plurality of word lines, a plurality of bit line pairs, a row select circuit, and a precharging circuit.

The memory array includes a plurality of memory cells arranged in a matrix of rows and columns. The plurality of word lines are provided respectively to rows of the plurality of memory cells. The plurality of bit line pairs each include first and second bit lines and are respectively provided to columns of the plurality of memory cells.

Each of the plurality of memory cells includes first and second access transistors having their respective gates connected to a same one of the plurality of word lines and connecting the first and second bit lines respectively to first and second internal nodes, a first driver transistor connected between a power-supply node to which an inactivating potential is provided and the first internal node and having a gate connected to the second internal node, and a second driver transistor connected between the power-supply node to which the inactivating potential is provided and the second internal node, and having a gate connected to the first internal node.

The row select circuit, when making an access to the memory array, selects one of the plurality of word lines according to a row address signal, provides an activating potential to the selected word line, and provides an inactivating potential to the unselected word lines. Moreover, when the access to the memory array is completed, the row select circuit provides an intermediate potential between the activating potential and the inactivating potential to the plurality of word lines.

The precharging circuit precharges the plurality of bit lines after the access to the memory array is completed.

Thus, the main advantages of the present invention are that a memory cell can stably retain the H level data since the current required for the stable data retention can be obtained from a precharged bit line by controlling the potential of a word line such that a leakage of a suitable size occurs in an access transistor during standby, and that the production margin of the characteristics for a transistor is increased so that the design is facilitated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
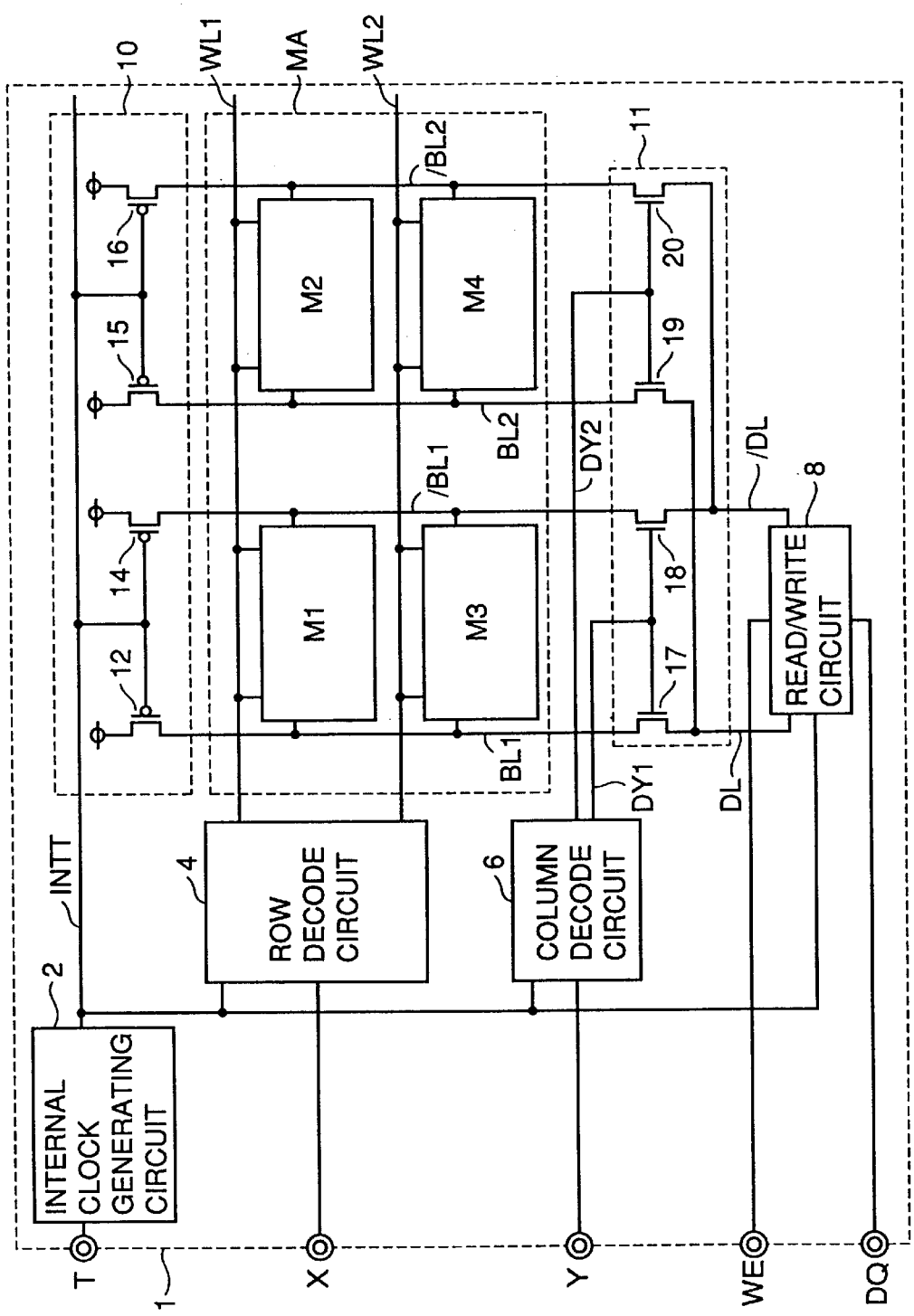
FIG. 1 is a block diagram representing the configuration of a semiconductor memory device 1 according to a first embodiment of the present invention.

The embodiments of the present invention will be described in detail below in relation to the drawings. Throughout the drawings, the same reference characters indicate the same or corresponding parts.

First Embodiment

FIG. 1 is a block diagram representing the configuration of a semiconductor memory device 1 according to the first embodiment of the present invention.

As shown in FIG. 1, semiconductor memory device 1 includes a memory array MA including memory cells M1, M2, M3, and M4 arranged in a matrix of rows and columns, a word line WL1 for selecting memory cells M1 and M2, a word line WL2 for selecting memory cells M3 and M4, bit lines BL1 and /BL1 correspondingly provided to memory cells M1 and M3, bit lines BL2 and /BL2 correspondingly provided to memory cells M2 and M4, and an internal clock generating circuit 2 for outputting an internal clock signal INTT according to a clock signal T.

Semiconductor memory device 1 further includes a precharging circuit 10 for precharging bit lines BL1, /BL1, BL2, and /BL2 according to internal clock signal INTT, a row decode circuit 4 for activating word lines WL1 and WL2 according to internal clock signal INTT and a row address signal X, a column decode circuit 6 for outputting column select signals DY1 and DY2 according to internal clock signal INTT and a column address signal Y, a gate circuit 11 for connecting one of bit lines BL1 and BL2 to a data line DL and for connecting one of bit lines /BL1 and /BL2 to a data line /DL according to column select signals DY1 and DY2, and a read/write circuit 8 for writing an input/output data signal DQ into a memory cell according to a write control signal WE during a data write operation and for outputting the data read from a memory cell as input/output data signal DQ during a data read operation.

Precharging circuit 10 includes a P-channel MOS transistor 12 connected between a power-supply node and bit line BL1 for receiving internal clock signal INTT at a gate, a P-channel MOS transistor 14 connected between a power-supply node and bit line /BL1 for receiving internal clock signal INTT at a gate, a P-channel MOS transistor 15 connected between a power-supply node and bit line BL2 for receiving internal clock signal INTT at a gate, and a P-channel MOS transistor 16 connected between a power-supply node and bit line /BL2 for receiving internal clock signal INTT at a gate.

Gate circuit 11 includes an N-channel MOS transistor 17 activated according to column select signal DY1 for connecting bit line BL1 to data line DL, an N-channel MOS transistor 18 activated according to column select signal DY1 for connecting bit line /BL1 to data line /DL, an N-channel MOS transistor 19 activated according to column select signal DY2 for connecting bit line BL2 to data line DL, and an N-channel MOS transistor 20 activated according to column select signal DY2 for connecting bit line /BL2 to data line ADL.

Figure 2:
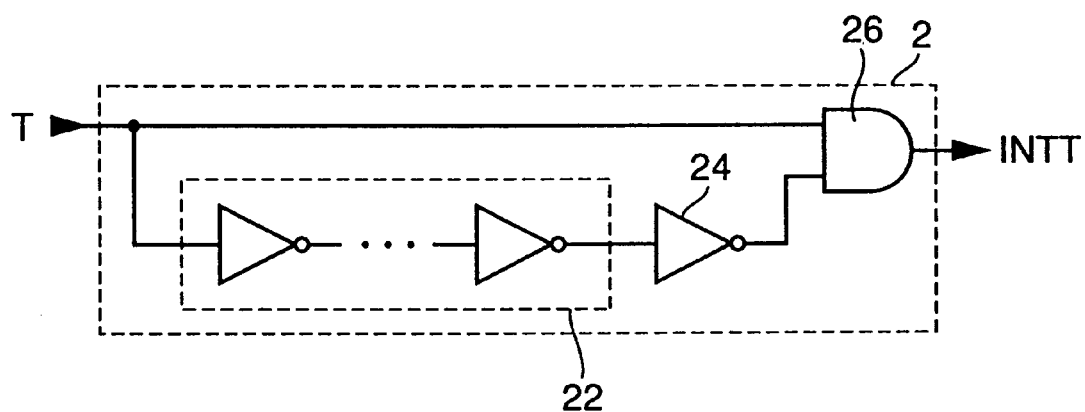
FIG. 2 is a circuit diagram representing the configuration of an internal clock generating circuit 2 shown in FIG. 1.

FIG. 2 is a circuit diagram representing the configuration of internal dock generating circuit 2 shown in FIG. 1.

As shown in FIG. 2, internal clock generating circuit 2 includes a delay circuit 22 for receiving and delaying a clock signal T, an inverter 24 for receiving and inverting an output from delay circuit 22, and an AND circuit 26 for receiving clock signal T and an output from inverter 24. AND circuit 26 outputs an internal clock signal INTT.

Delay circuit 22, for instance, is formed by inverters of even-numbered stages connected in series.

Figure 3:
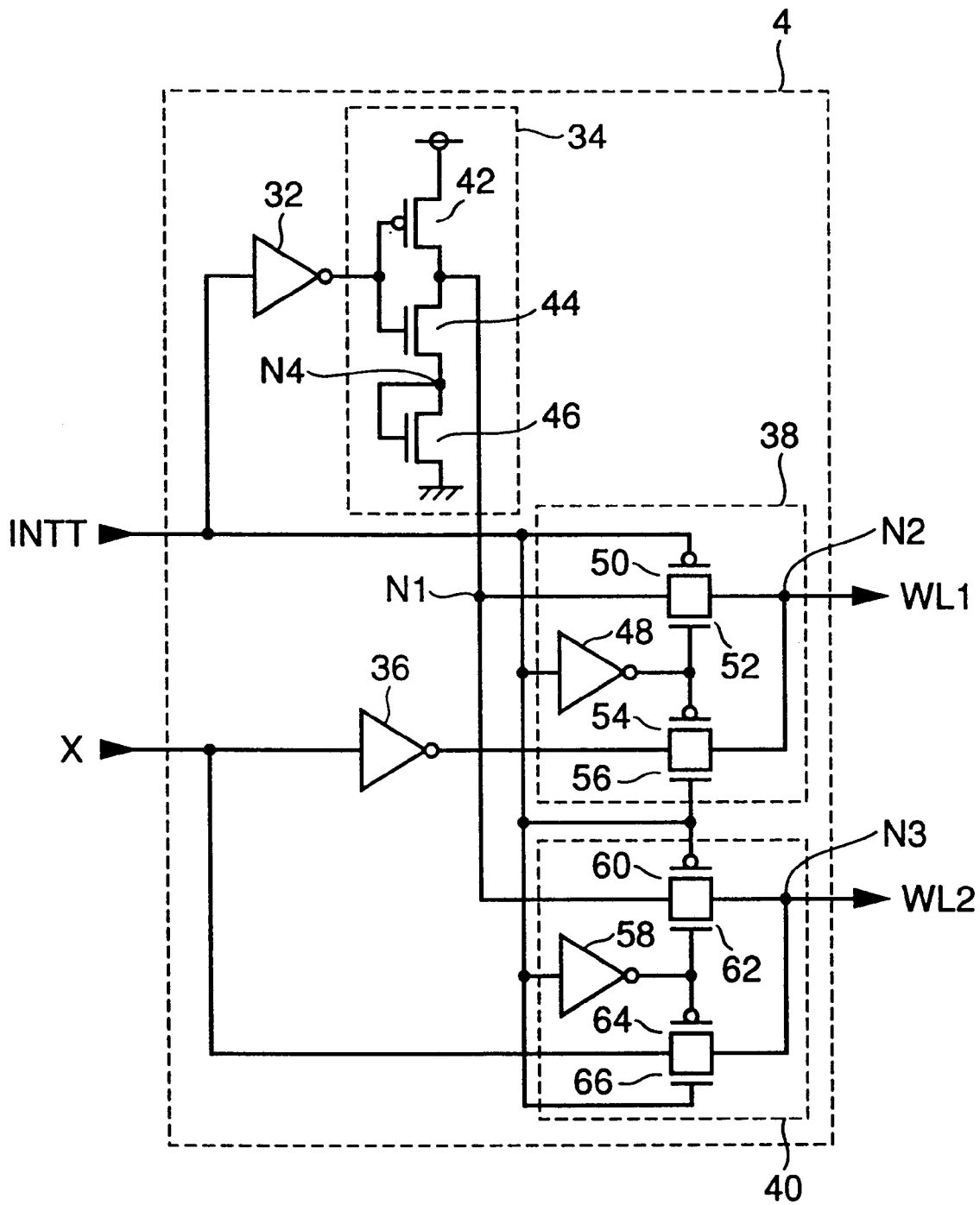
FIG. 3 is a circuit diagram representing the configuration of a row decode circuit 4 shown in FIG. 1.

FIG. 3 is a circuit diagram representing the configuration of row decode circuit 4 of FIG. 1.

As shown in FIG. 3, row decode circuit 4 includes an inverter 32 for receiving and inverting an internal clock signal INTT, an inverter 34 for receiving and inverting an output from inverter 32 and for outputting the inverted output to a node N1, an inverter 36 for receiving and inverting a row address signal X, a selecting circuit 38 for outputting to word line WL1 one of an output from inverter 34 and an output from inverter 36 according to internal clock signal INTT, and a selecting circuit 40 for outputting to word line WL2 one of row address signal X and the output from inverter 34 according to internal clock signal INTT.

Inverter 34 includes an N-channel MOS transistor 46 having a source connected to a ground node and having a gate and a drain connected to a node N4, and a P-channel MOS transistor 42 and an N-channel MOS transistor 44 which are connected in series between a power-supply node and node N4, and both of which receive the output from inverter 32 at their respective gates. The node connecting P-channel MOS transistor 42 and N-channel MOS transistor 44 outputs the output of inverter 34 which is provided to node N1.

Selecting circuit 38 includes an inverter 48 for receiving and inverting internal clock signal INTT, a P-channel MOS transistor 50 connected between node N1 and a node N2 for receiving internal clock signal INTT at a gate, an N-channel MOS transistor 52 connected between node N1 and node N2 for receiving an output from inverter 48 at a gate, a P-channel MOS transistor 54 connected between an output node of inverter 36 and node N2 for receiving the output from inverter 48 at a gate, and an N-channel MOS transistor 56 connected between the output node of inverter 36 and node N2 for receiving internal clock signal INTT at a gate.

Selecting circuit 40 includes an inverter 58 for receiving and inverting internal clock signal INTT, a P-channel MOS transistor 60 connected between node N1 and a node N3 for receiving internal clock signal INTT at a gate, an N-channel MOS transistor 62 connected between node N1 and node N3 for receiving an output from inverter 58 at a gate, a P-channel MOS transistor 64, connected between a node receiving a row address signal X and node N3, for receiving the output from inverter 58 at a gate, and an N-channel MOS transistor 66, connected between the node receiving row address signal X and node N3, for receiving internal clock signal INTT at a gate.

Figure 4:
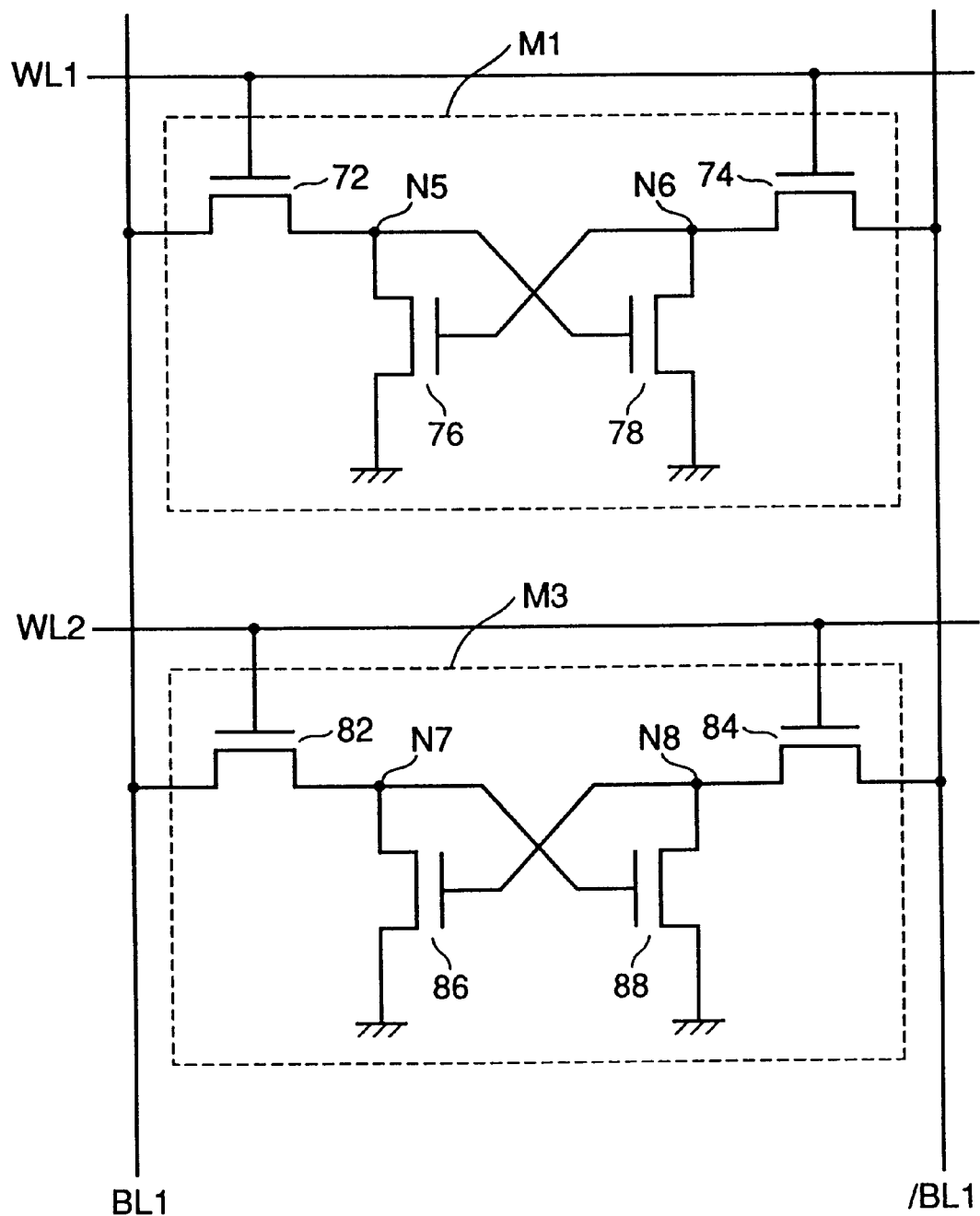
FIG. 4 is a circuit diagram representing the configuration of memory cells M1 and M3 shown in FIG. 1.

FIG. 4 is a circuit diagram representing the configuration of memory cells M1 and M3 in FIG. 1.

As shown in FIG. 4, memory cell M1 includes an N-channel MOS transistor 72 connected between a bit line BL1 and a node N5 and having a gate connected to a word line WL1, an N-channel MOS transistor 74 connected between a bit line /BL1 and a node N6 and having a gate connected to word line WL1, an N-channel MOS transistor 76 connected between node N5 and a ground node and having a gate connected to node N6, and an N-channel MOS transistor 78 connected between node N6 and a ground node and having a gate connected to node N5.

N-channel MOS transistors 72 and 74 are referred to as access transistors, and N-channel MOS transistors 76 and 78 are referred to as driver transistors.

Memory cell M3 includes an N-channel MOS transistor 82 connected between bit line BL1 and a node N7 and having a gate connected to a word line WL2, an N-channel MOS transistor 84 connected between bit line /BL1 and a node N8 and having a gate connected to word line WL2, an N-channel MOS transistor 86 connected between node N7 and a ground node and having a gate connected to node N8, and an N-channel MOS transistor 88 connected between node N8 and a ground node and having a gate connected to node N7.

In memory cells M2 and M4 shown in FIG. 1, bit lines BL2 and /BL2 respectively replace bit lines BL1 and /BL1 in the configuration of memory cells M1 and M3 shown in FIG. 4. The internal configuration of the memory cells are the same so that the description thereof will not be repeated.

Figure 5:
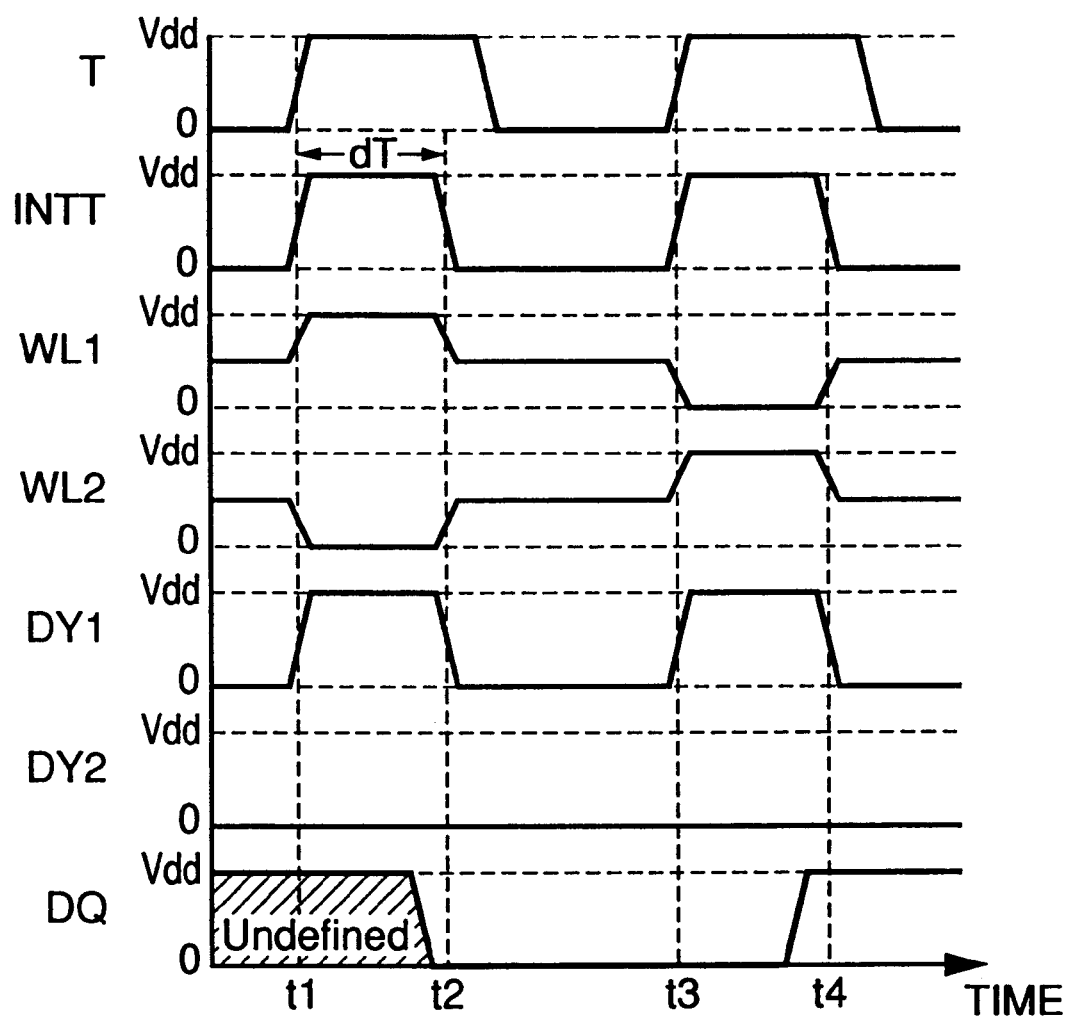
FIG. 5 is an operational waveform chart related to the description of the operation of semiconductor memory device 1 shown in FIG. 1.

FIG. 5 is an operational waveform chart related to the description of the operation of semiconductor memory device 1 shown in FIG. 1.

Referring to FIGS. 1 and 5, let us first assume that node N5 in memory cell M1 stores the L level data as its initial state, and node N7 in memory cell M3 stores the H level data.

While clock signal T is at the L level, internal clock signal INTT is also at the L level.

At this time, the potential of node N1 in FIG. 3 which is an internal node of row decode circuit 4 is set higher from the ground potential by the threshold voltage of N-channel MOS transistor 46. N-channel MOS transistor 46 has its gate connected to its drain so that the current flowing through N-channel MOS transistor 46 becomes small when the potential of the drain falls down to around the level of the threshold voltage. The potential of node N1 at this time is output to all word lines WL1 and WL2 via selecting circuits 38 and 40.

The H level data held in node N7 of FIG. 4 is retained by the current flowing from bit line BL1 via N-channel MOS transistor 82. The current value required for data retention can be set by adjusting the L level of the potential of a word line. This adjustment is effected by setting the L level output by inverter 34 shown in FIG. 3 to a potential slightly higher than a ground potential by the provision of N-channel MOS transistor 46.

At time t1, clock signal T rises and a read operation from memory cell M1 begins.

Word line WL1 and column select signal DY1 attain the H level so that memory cell M1 is selected. At this time, the unselected word line WL2 is at the L level. The H level of word line WL1 is determined by the H level output by inverter 36. The L level of word line WL2 is determined by the L level of row address signal X.

When word line WL1 attains the H level, a current flows from bit line BL1 into node N5 in FIG. 4. At this time, word line WL2 is at a ground potential and N-channel MOS transistor 82 is in the non-conductive state so that bit line BL1 is unaffected by memory cell M3.

Memory cell M3 of FIG. 4 which is unselected during a read operation retains the data by two transistors, N-channel MOS transistors 86 and 88, since the access transistors are in the non-conductive state. Consequently, after a long period of time, the H level data held in node N7 is corrupted by the leakage current from node N7 into the substrate and the leakage current of N-channel MOS transistor 86, and so on. The data, however, can be retained by the parasitic capacitance of node N7 and the like for a sufficiently short period of time.

In order to extend this time of data retention, capacitors can be provided to nodes N7 and N8 as will be described later.

The potential difference generated between bit lines BL1 and /BL1 is amplified by read/write circuit 8 and is output to the outside as input/output data signal DQ.

Moreover, a clock pulse width dT of internal clock signal INTT can be set by the delay time of delay circuit 22 shown in FIG. 2.

At time t2, internal clock signal INTT falls to the L level, and the access is completed.

Once again, all word lines attain a potential between a ground potential and a power-supply potential, that is, the L level output by inverter 34 shown in FIG. 3.

The bit lines are once again charged by precharging circuit 10, and the H level data held by the memory cell is retained by the current through the access transistor.

Then, at time t3, the read operation from memory cell M3 begins.

At this time, word line WL2 and column select signal DY1 attain the H level so that memory cell M3 is selected. Word line WL2 attains the H level according to row address signal X and word line WL1 attains the L level.

At time t4, the data read operation from memory cell M3 is completed, and internal clock signal INTT falls. Then once again, each bit line is charged, going back to the initial state.

As shown above, the row decode circuit that drives a word line sets the L level of the word line slightly higher than a ground potential during standby so that a greater leakage current flows through the access transistor than in the case of the conventional semiconductor memory device. Thus, by precharging a bit line to the H level, the memory cell can reliably retain the H level data. As a result, the production margin of the characteristics for a transistor is increased, facilitating the design.

Figure 6:
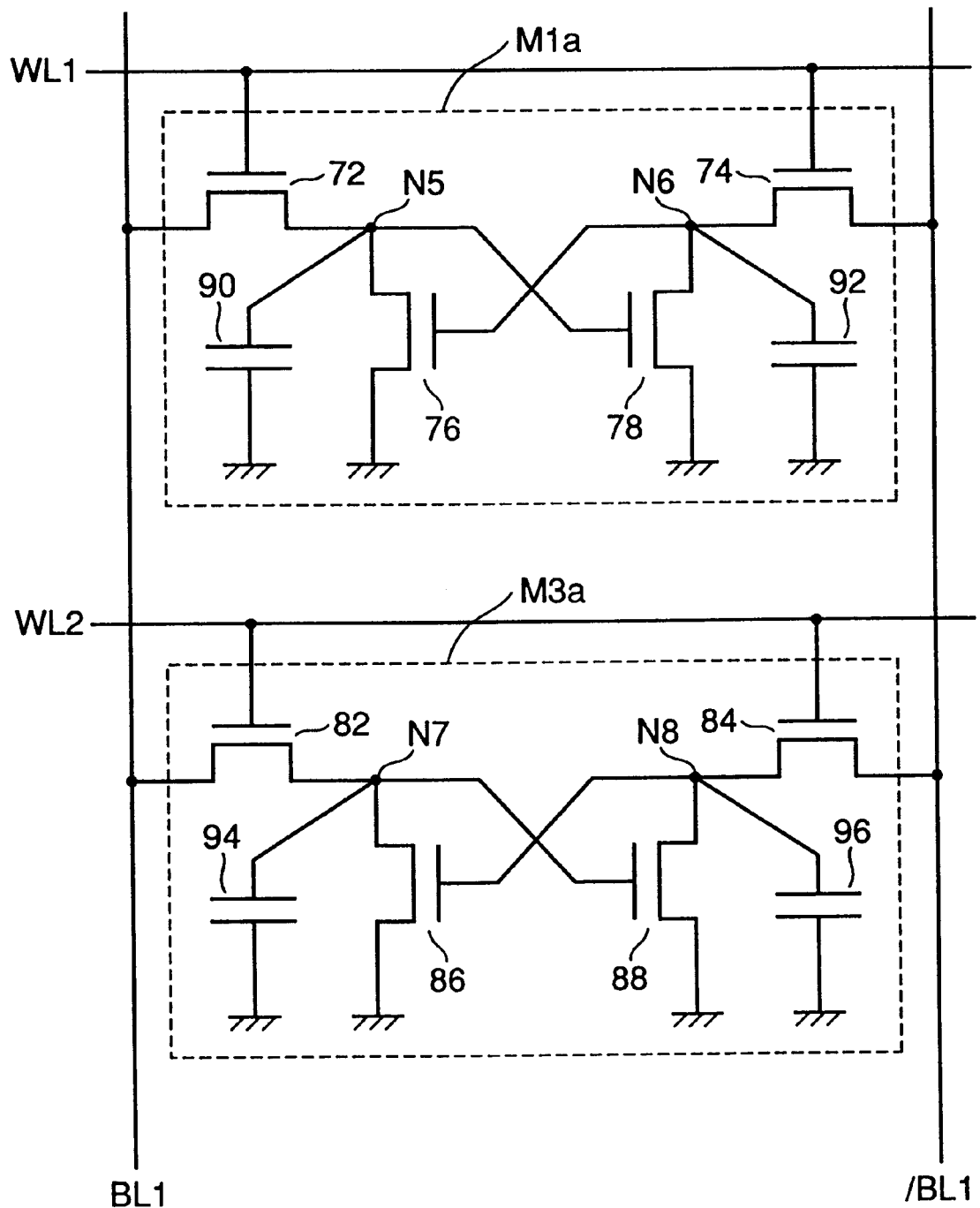
FIG. 6 is a circuit diagram showing the structure of memory cells according to a variation of the first embodiment.

FIG. 6 is a circuit diagram representing the structure of memory cells according to a variation of the fast embodiment.

As shown in FIG. 6, the variation of the first embodiment differs from the first embodiment in that the former includes memory cells M1a and M3a in place of memory cells MI and M3. In addition to the configuration of memory cell M1 shown in FIG. 4, memory cell M1a includes a capacitor 90 connected between node N5 and a ground node and a capacitor 92 connected between node N6 and a ground node. The configuration of other parts is the same as memory cell M1 shown in FIG. 4, and the description thereof will not be repeated.

Memory cell M3a differs from memory cell M3 shown in FIG. 4 in that the former further includes a capacitor 94 connected between node N7 and a ground node and a capacitor 96 connected between node N8 and a ground node in addition to the configuration of memory cell M3 shown in FIG. 4. The configuration of other parts is the same as memory cell M3 shown in FIG. 4 so that the description will not be repeated.

Such a configuration allows the H level held by the memory cell to be retained even when time of access dT to the memory cell shown in FIG. 5 is relatively long.

Second Embodiment

The semiconductor memory device according to the second embodiment differs from the semiconductor memory device according to the first embodiment in the configuration of memory cells M1, M2, M3, and M4.

Figure 7:
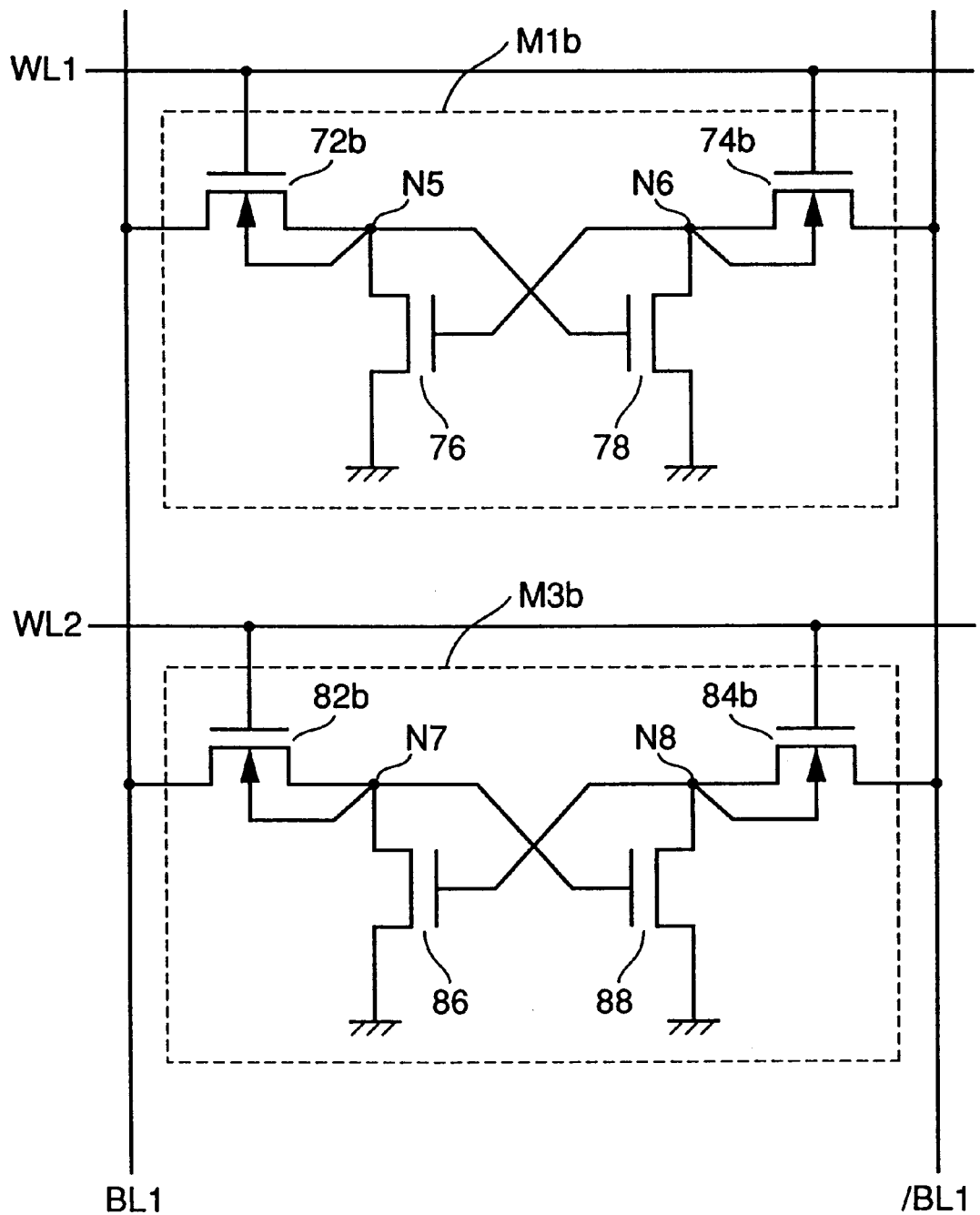
FIG. 7 is a circuit diagram representing the configuration of memory cells M1b and M3b contained in a semiconductor memory device according to a second embodiment.

FIG. 7 is a circuit diagram representing the configuration of memory cells M1b and M3b contained in the semiconductor memory device according to the second embodiment.

As shown in FIG. 7, in memory cell M1b, an N-channel MOS transistor 72b replaces N-channel MOS transistor 72 and an N-channel MOS transistor 74b replaces N-channel MOS transistor 74 in the configuration of memory cell M1 shown in FIG. 4.

N-channel MOS transistor 72b has a back gate connected to node N5. In other words, the P-well in which N-channel MOS transistor 72b is formed is connected to node N5. N-channel MOS transistor 74b has a back gate connected to node N6. In other words, the P-well in which N-channel MOS transistor 74b is formed is connected to node N6.

In memory cell M3b, an N-channel MOS transistor 82b replaces N-channel MOS transistor 82 and an N-channel MOS transistor 84b replaces N-channel MOS transistor 84 in the configuration of memory cell M3 shown in FIG. 4.

N-channel MOS transistor 82b has a back gate connected to node N7.

In other words, the P-well in which N-channel MOS transistor 82b is formed is connected to node N7. N-channel MOS transistor 84b has a back gate connected to node N8. In other words, the P-well in which N-channel MOS transistor 84b is formed is connected to node N8.

In order to implement such a configuration, the well of each access transistor must be isolated. Such isolation of wells is made possible without the increase in layout area, for example, by using the SOI process as will be described below.

The overall configuration of the second embodiment is the same as that of the first embodiment shown in FIG. 1 so that the description will not be repeated.

Moreover, the same circuit as that used in the conventional example, that is, a circuit that uses the L level of a word line during standby as a ground potential can be employed as a row address decoder. In the second embodiment, however, a circuit shown in FIG. 4 is employed.

Figure 8:
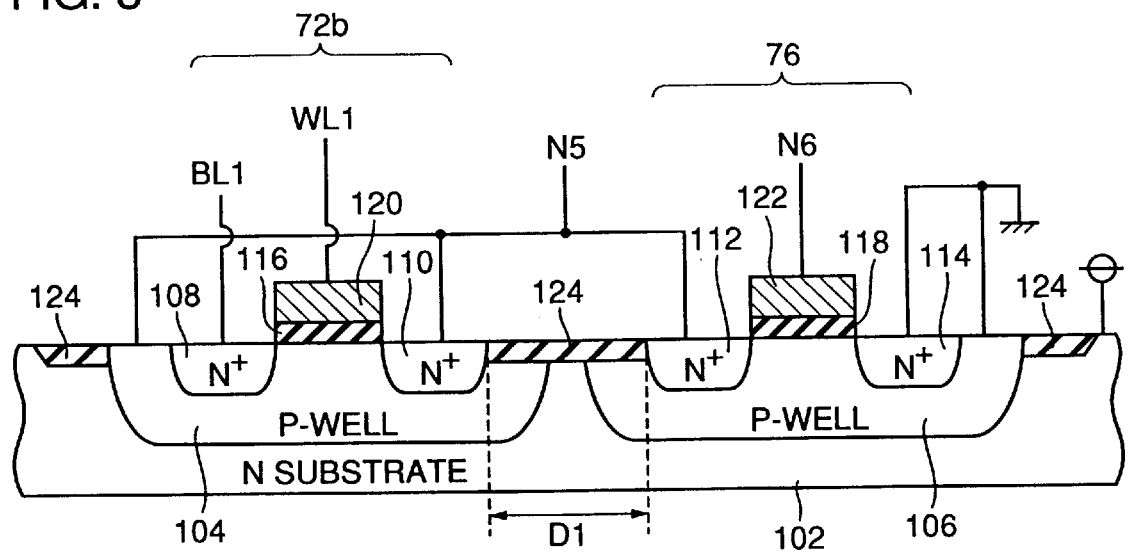
FIG. 8 is a across sectional view of a memory cell shown in FIG. 7 formed by an ordinary bulk CMOS (Complementary Metal-Oxide Semiconductor) process.

FIG. 8 is a cross sectional view of a memory cell shown in FIG. 7 formed by an ordinary bulk CMOS process.

As shown in FIG. 8, P-wells 104 and 106 are formed on a main surface of an N substrate 102. N-type impurity regions 108 and 110 are formed within P-well 104. A gate oxide film 116 is formed on the main surface in the region between N-type impurity regions 108 and 110, and a gate electrode 120 is formed on gate oxide film 116. These described elements correspond to N-channel MOS transistor 72b.

On the other hand, N-type impurity regions 112 and 114 are formed within P-well 106. A gate oxide film 118 is formed on the main surface in the region between N-type impurity regions 112 and 114, and a gate electrode 122 is formed on gate oxide film 118. An insulating film 124 for separating the transistors is provided in the region between N-type impurity regions 110 and 112.

N-type impurity region 108 is connected to bit line BL1, and gate electrode 120 is connected to word line WL1. N-type impurity region 110, P-well 104, and N-type impurity region 112 are connected to node N5. Gate electrode 122 is connected to node N6. N-type impurity region 114 and P-well 106 are coupled to a ground potential.

In such a structure, N-type impurity region 110 and N-type impurity region 112 must be set apart by a distance D1 in order to separate the potential of P-well 104 from the potential of P-well 106.

Figure 9:
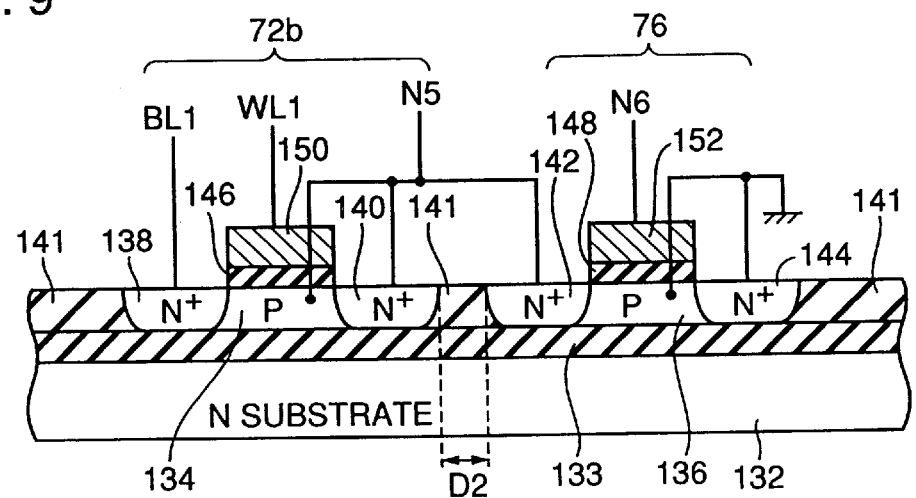
FIG. 9 is a cross sectional view of a memory cell shown in FIG. 7 produced by an SOI (Silicon On Insulator) process.

FIG. 9 is a cross sectional view of a memory cell shown in FIG. 7 produced by SOI process.

As shown in FIG. 9, an insulating film 133 is formed on an N substrate 132. On insulating film 133 are formed N-type impurity regions 138, 140, 142, and 144, P-type body regions 134 and 136, and an insulating film region 141 for separating the transistors.

A gate oxide film 146 is formed on P-type body region 134, and a gate electrode 150 is formed above gate oxide film 146.

A gate oxide film 148 is formed on P-type body region 136, and a gate electrode 152 is formed above gate oxide film 148.

N-type impurity regions 138 and 140, P-type body region 134, gate oxide film 146, and gate electrode 150 correspond to N-channel MOS transistor 72b shown in FIG. 7. Therefore, by applying a potential to P-type body region 134, the potential can be applied to the back gate of N-channel MOS transistor 72b.

N-type impurity regions 142 and 144, P-type body region 136, gate oxide film 148, and gate electrode 152 corresponded to N-channel MOS transistor 76 in FIG. 7. Therefore, by applying a potential to P-type body region 136, the potential can be applied to the back gate of N-channel MOS transistor 76.

N-type impurity region 138 is connected to bit line BL1, and gate electrode 150 is connected to word line WL1. P-type body region 134 and N-type impurity regions 140 and 142 are connected to node N5. Gate electrode 152 is connected to node N6. P-type body region 136 and N-type impurity region 144 are coupled to a ground potential.

By adapting the SOI process, a distance D2 between the edges defining the region that separates N-channel MOS transistor 72b from N-channel MOS transistor 76 can be made smaller than in the case shown in FIG. 8.

Figure 10:
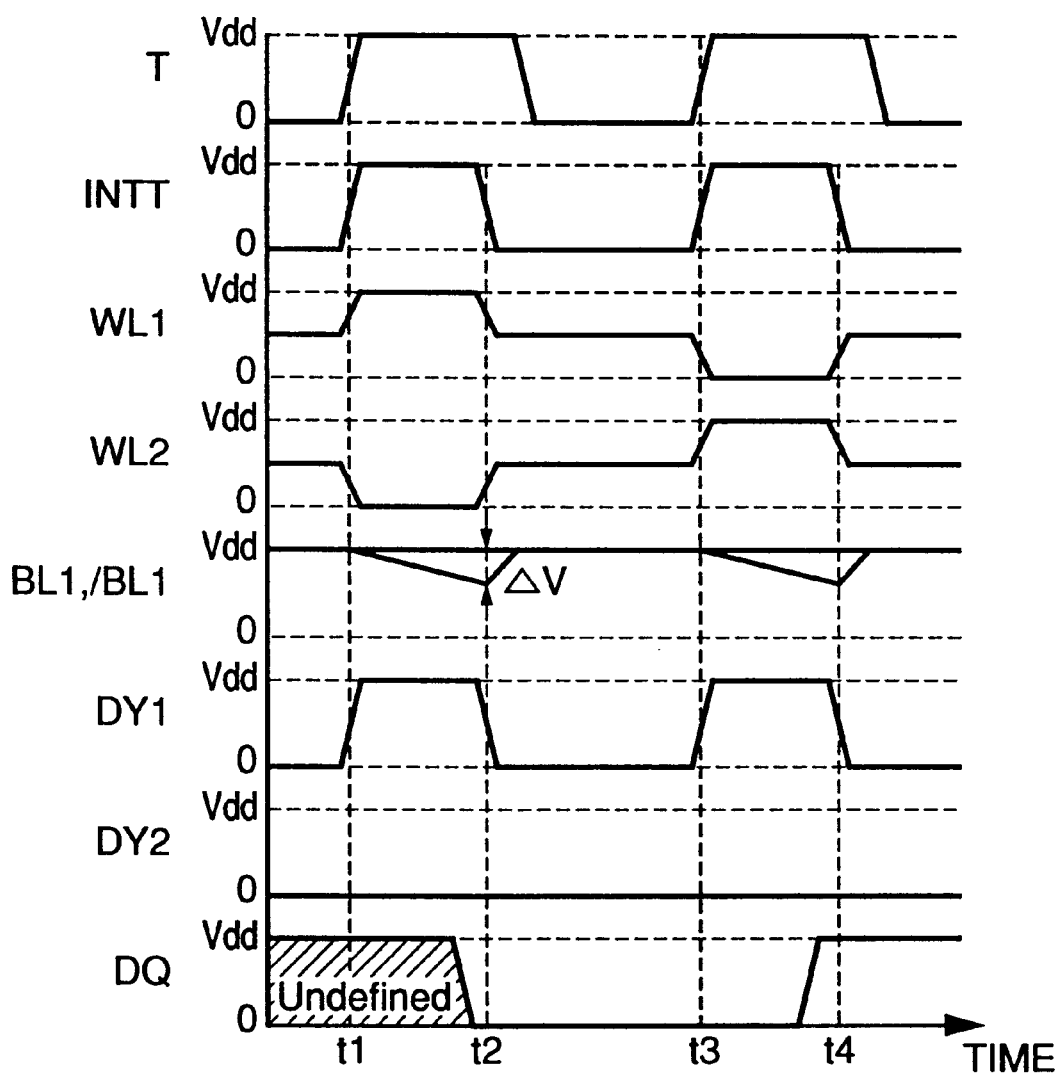
FIG. 10 is an operational waveform chart related to the description of the operation of the semiconductor memory device according to the second embodiment.

FIG. 10 is an operational waveform chart related to the description of the operation of the semiconductor memory device according to the, second embodiment.

Referring to FIGS. 7 and 10, initially, while clock signal T is at the L level, row decode circuit 4 causes all word lines to attain a potential between a ground potential and a power-supply potential.

Assuming that node N5 is at the L level, the well potential of N-channel MOS transistor 72b is at the ground potential so that N-channel MOS transistor 72b has the same characteristics as an ordinary access transistor.

On the other hand, assuming that the potential of node N7 is at the H level, in N-channel MOS transistor 82b which is an access transistor, the well potential is higher than the ground potential so that the threshold voltage becomes low and the current flowing through N-channel MOS transistor 82b increases. Thus, there is an increase in the current flowing only into a node which requires that retention. The potential of a node holding the H level within a memory cell is retained by this current. The threshold voltage of an access transistor making an access to the node holding the H level data is lowered due to the substrate bias effect.

Here, as in the first embodiment, the leakage current of the access transistor can be set to an appropriate value by setting the potential of a word line to an intermediate potential during standby.

Then at time t1, the read operation from memory cell M1b begins.

Word line WL1 and column select signal DY1 attain the H level so that memory cell M1b is selected. At this time, the potential of the unselected word line WL2 is at a ground potential. When the potential of word line WL1 is brought to the H level, the current flows from bit line BL1 into node N5 inside memory cell M1b. Consequently, the potential of bit line BL1 is lowered.

When a potential change ΔV of bit line BL1 becomes greater than the flat band voltage of the PN junction, a forward current is caused to flow from the well of N-channel MOS transistor 82b which is an access transistor in the unselected memory cell M3b toward a source connected to bit line BL1. The flat band voltage of the PN junction is the forward voltage applied to the PN junction that causes the forward current of a value greater than or equal to a prescribed value to begin to flow.

Thus, potential change ΔV is set to a value not greater than the flat band voltage of the PN junction. For this purpose, the pulse width of internal clock signal INTT that is generated according to a rise of clock signal T is set to an appropriate value Therefore, the activation time of a word line is determined by setting the delay time of delay circuit 22 in internal clock generating circuit 2 shown in FIG. 2 in a suitable manner.

The potential change ΔV generated between bit lines BL1 and /BL1 is amplified by read/write circuit 5 and is output to the outside as input/output data signal DQ.

The current required for data retention can be further increased in the above-described configuration as well so that the data retention characteristic is improved.

Third Embodiment

Figure 11:
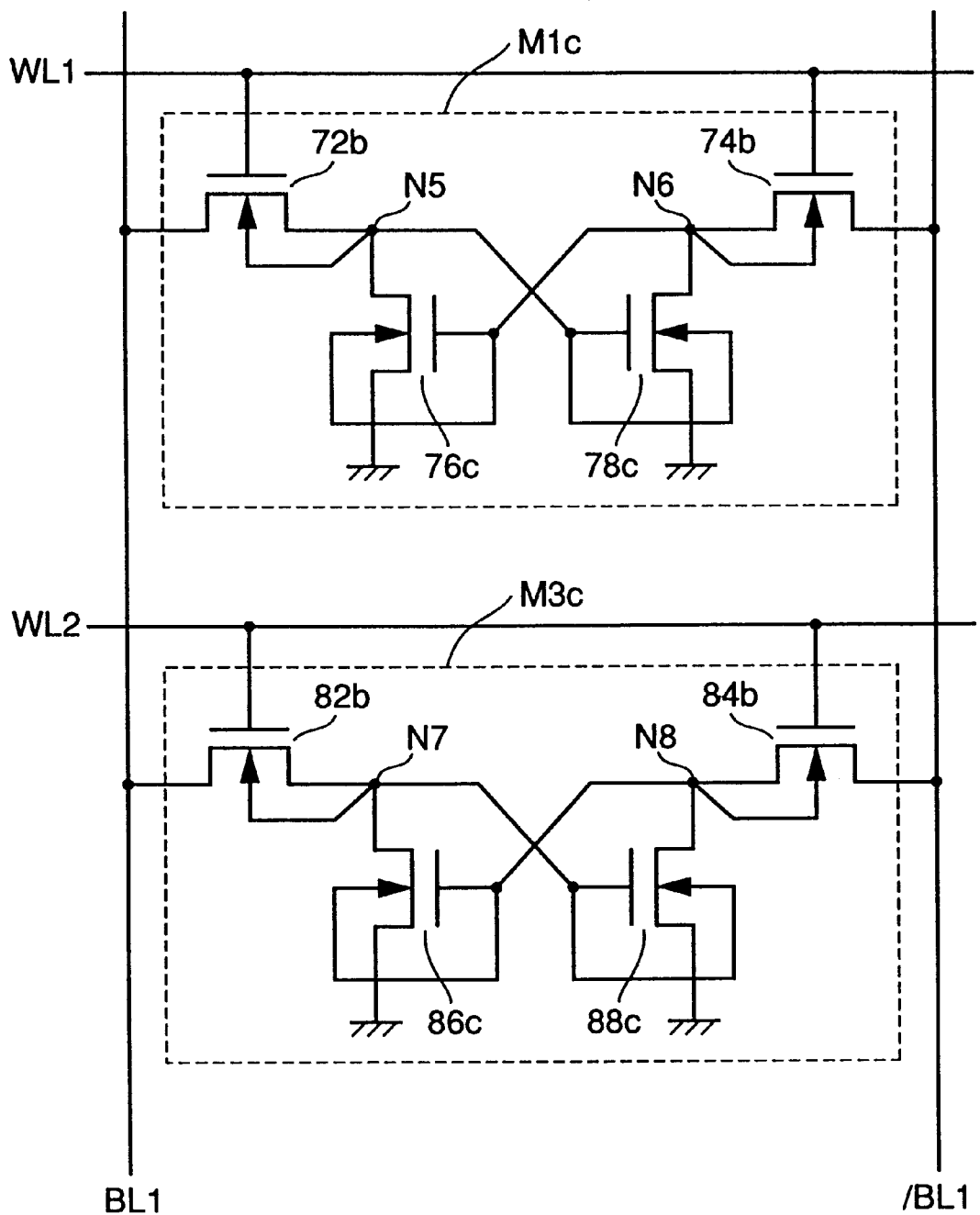
FIG. 11 is a circuit diagram representing the configuration of memory cells M1c and M3c contained in a semiconductor memory device according to a third embodiment.

FIG. 11 is a circuit diagram representing the configuration of memory cells M1c and M3c contained in the semiconductor memory device according to the third embodiment.

Memory cell M1c differs from memory cell M1b shown in FIG. 7 in that N-channel MOS transistor 76c replaces N-channel MOS transistor 76 and an N-channel MOS transistor 78c replaces N-channel MOS transistor 78. The configuration of other parts is the same as that of memory cell M1b so that the description thereof will not be repeated.

Memory cell M3c differs from memory cell M3b shown in FIG. 7 in that an N-channel MOS transistor 86c replaces N-channel MOS transistor 86 and an N-channel MOS transistor 88c replaces N-channel MOS transistor 88. The configuration of other parts is the same as that of memory cell M3b shown in FIG. 7 so that the description will not be repeated.

In each of N-channel MOS transistors 76c, 78c, 86c, and 88c, a gate is connected to a back gate.

In a memory cell according to the second embodiment shown in FIG. 7, three different kinds of well potentials are required for each N-channel MOS transistor. On the other hand, only two kinds of well potentials are required in a memory cell shown in FIG. 11 so that, for instance, in memory cell M1c, N-channel MOS transistors 72b and 78c can be formed within a common well, and N-channel MOS transistors 76c and 74b can be formed within a common well.

Consequently, the memory cell area can be reduced.

Moreover, when node N5 holds the H level potential, node N6 is at the L level and the gate potential and well potential of N-channel MOS transistor 76c attains the ground potential so that the data retention characteristic is the same as that of memory cell M1b shown in FIG. 7. In addition, forward currents flow through the PN junctions between the sources and the wells of N-channel MOS transistors 76c and 78c which are driver transistors when the power-supply potential is higher than the flat band voltage of the PN junction so that the power-supply potential is set to be no greater than the flat band voltage of the PN junction.

In such a configuration, a well can be shared by two transistors, and the layout area for the memory array portion can be reduced in size.

The reduction in the layout area is effected in the manner described below in relation to the drawings.

Figure 12:
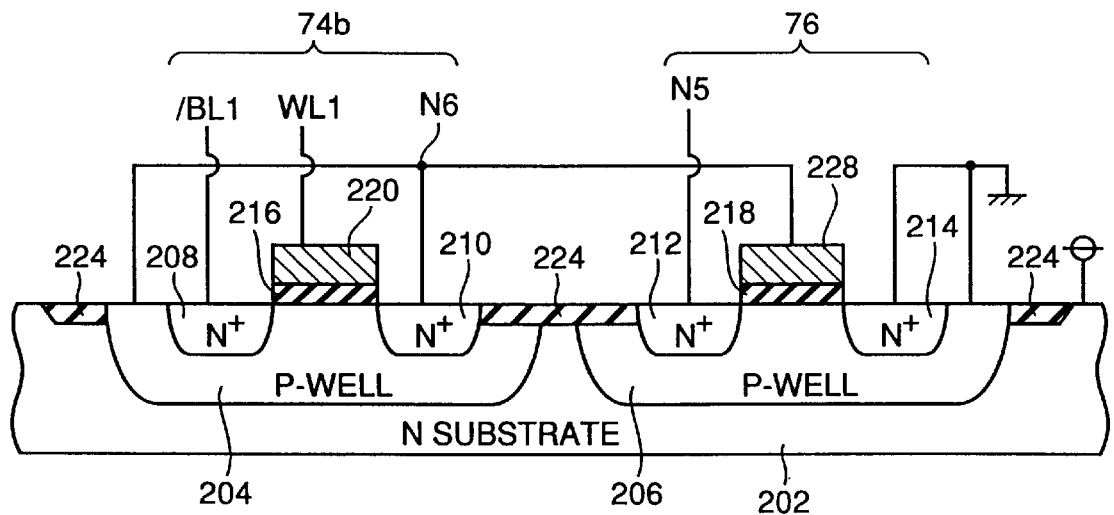
FIG. 12 is a across sectional view showing a cross section of N-channel MOS transistors 14b and 76 shown in FIG. 7 according to the second embodiment.

FIG. 12 is a cross sectional view showing the cross section of N-channel MOS transistors 74b and 76 shown in FIG. 7 according to the second embodiment.

As shown in FIG. 12, P-wells 204 and 206 are formed on an N substrate 202. N-type impurity regions 208 and 210 are formed within P-well 204, and a gate oxide film 216 is formed on the main surface in the region between N-type impurity regions 208 and 210. A gate electrode 220 is formed above gate oxide film 216.

N-type impurity regions 208 and 210, gate oxide film 216, and gate electrode 220 correspond to N-channel MOS transistor 74b.

N-type impurity regions 212 and 214 are formed within P-well 206. A gate oxide film 218 is formed on the main surface in the region between N-type impurity regions 212 and 214. A gate electrode 228 is formed above gate oxide film 218. An insulating film 224 for separating the transistors is provided in the region between N-type impurity regions 210 and 212.

N-type impurity regions 212 and 214, gate oxide film 218, and gate electrode 228 correspond to N-channel MOS transistor 76.

N-type impurity region 208 is connected to bit line /BL1. Gate electrode 220 is connected to word line WL1. N-type impurity region 210, P-well 204, and gate electrode 228 are connected to node N6.

N-type impurity region 212 is connected to node N5. N-type impurity region 214 and P-well 206 are coupled to a ground potential.

In the second embodiment, different potentials are provided to P-well 204 and P-well 206 so that a larger area was required to separate the two P-wells.

Figure 13:
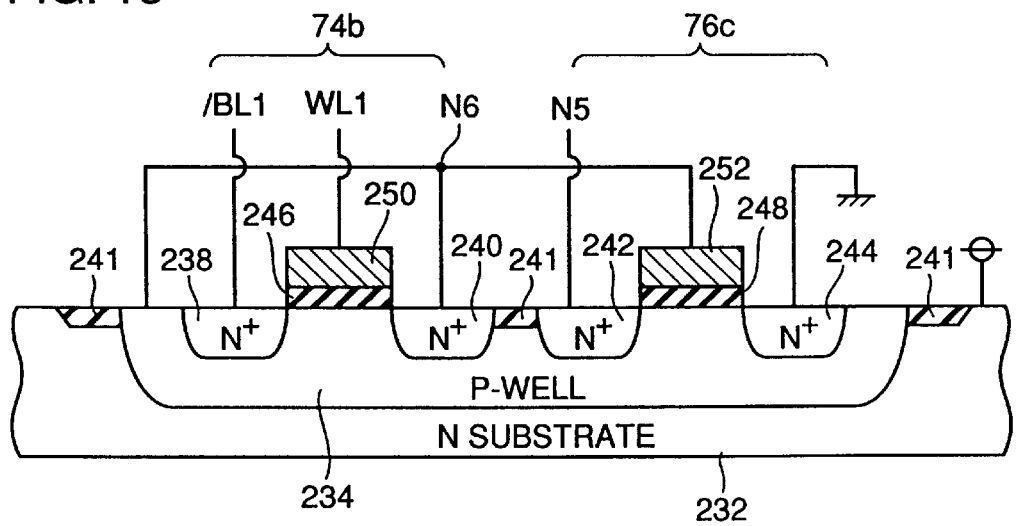
FIG. 13 is a cross sectional view related to the description of a cross section of a memory cell shown in FIG. 11.
Figure 14:
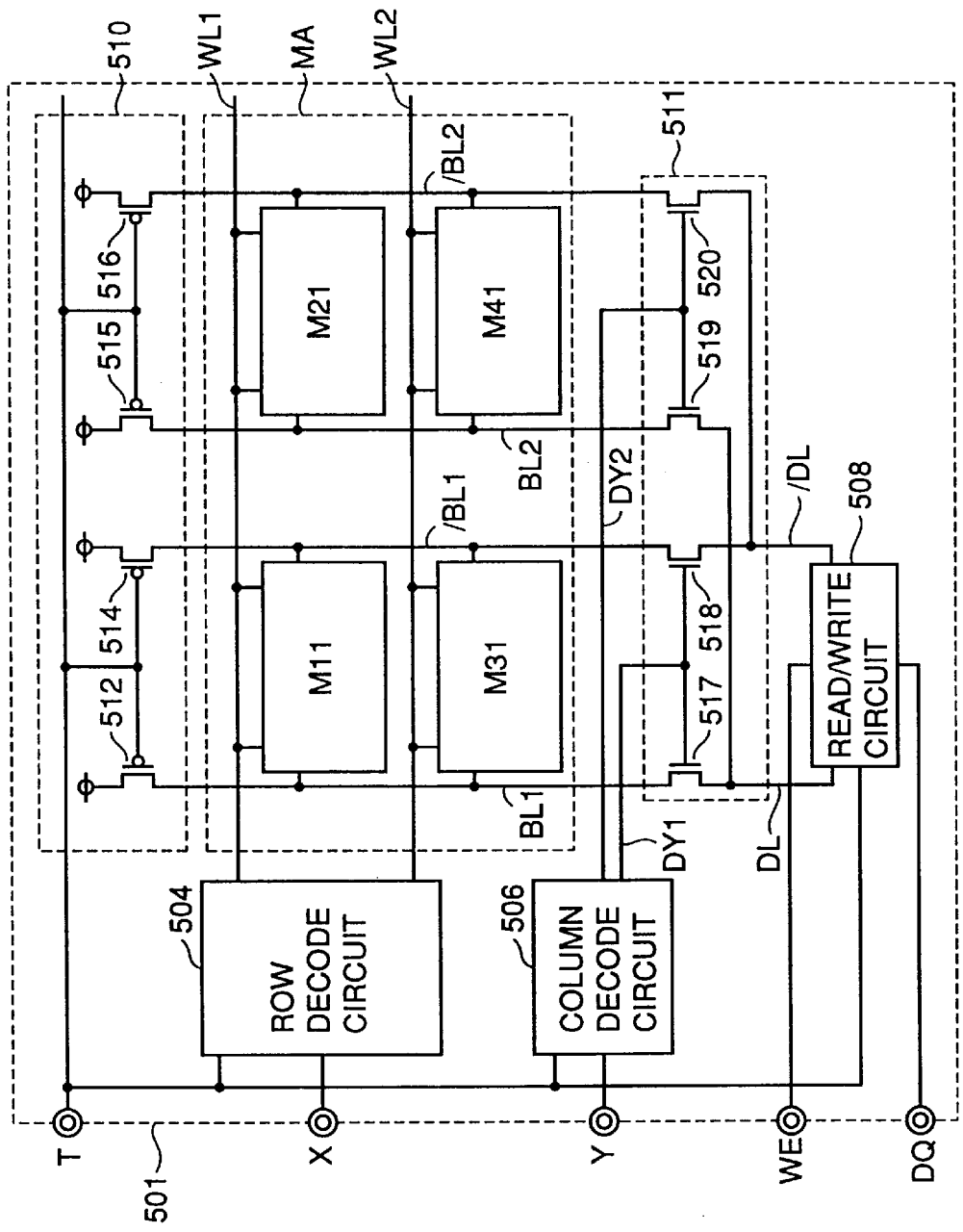
FIG. 14 is a block diagram representing the configuration of a conventional semiconductor memory device 501.
Figure 15:
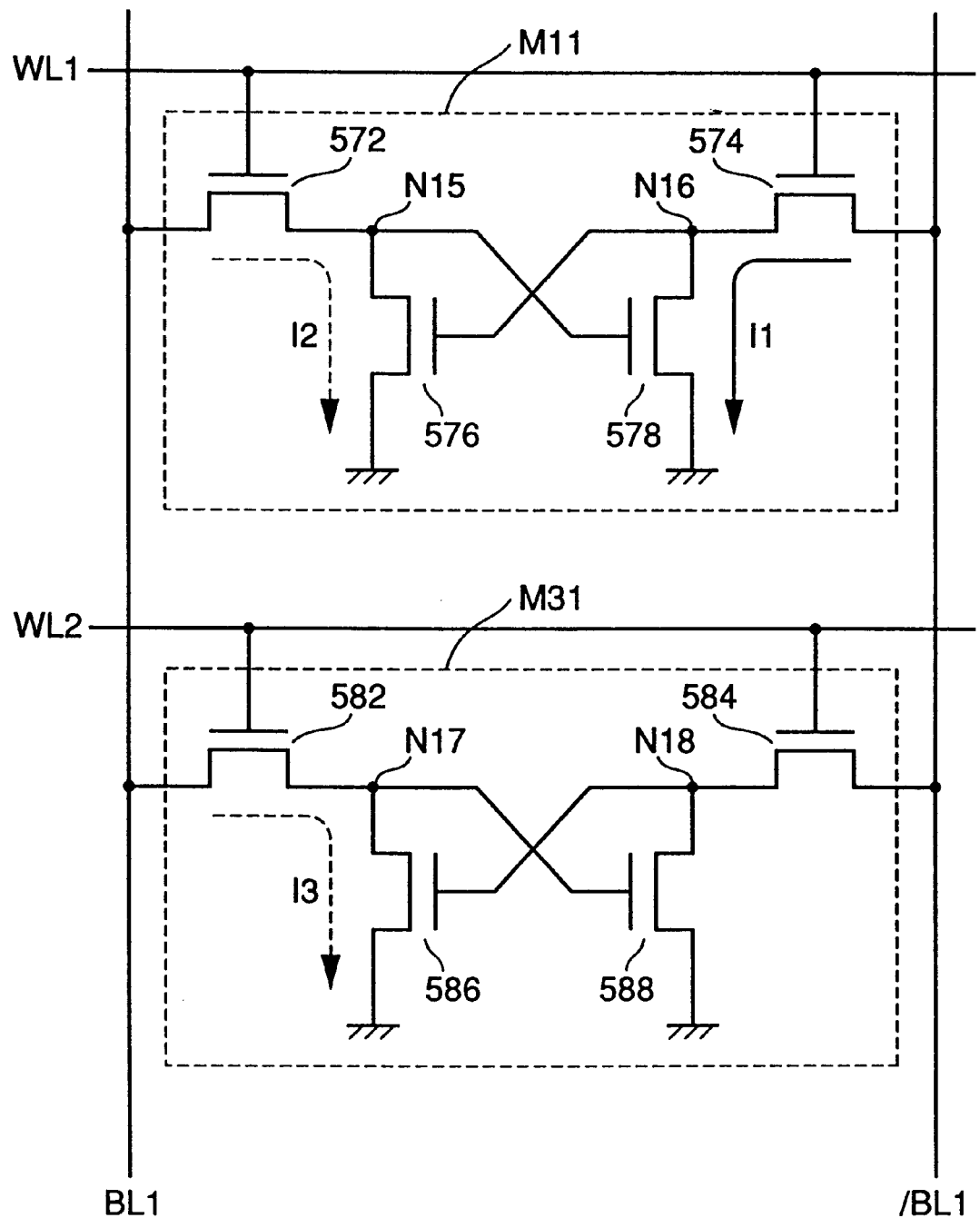
FIG. 15 is a circuit diagram representing the configuration of memory cells M11 and M31 shown in FIG. 14.

FIG. 13 is a cross sectional view related to the description of a cross section of a memory cell shown in FIG. 11.

As shown in FIG. 13, a P-well 234 is formed on an N substrate 232. N-type impurity regions 238, 240, 242, and 244 are formed within P-well 234. Moreover, an insulating film 241 for separating the transistors is provided.

A gate oxide film 246 is formed on a main surface in the region between N-type impurity regions 238 and 240. A gate electrode 250 is formed above gate oxide film 246.

A gate oxide film 248 is formed on the main surface in the region between N-type impurity regions 242 and 244. A gate electrode 252 is formed above gate oxide film 248.

N-type impurity regions 238 and 240, gate oxide film 246, and gate electrode 250 correspond to N-channel MOS transistor 74b in FIG. 11.

N-type impurity regions 242 and 244, gate oxide film 248, and gate electrode 252 correspond to N-channel MOS transistor 76c shown in FIG. 11.

N-type impurity region 238 is connected to bit line /BL1. Gate electrode 250 is connected to word line WL1.

N-type impurity region 240, P-well 234, and gate electrode 252 are connected to node N6. N-type impurity region 242 is connected to node N5. N-type impurity region 244 is coupled to a ground potential.

As seen from FIG. 13, a common potential can be provided to the well portion of N-channel MOS transistor 74b and the well portion of N-channel MOS transistor 76c so that N-channel MOS transistors 74b and 76c can be formed within one well in the memory cell shown in FIG. 11. Thus, the example shown in FIG. 13 has area advantage over the example shown in FIG. 12 in that there is no need to provide a well-separating region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a main surface of a semiconductor substrate, comprising:

a memory array including a plurality of memory cells arranged in a matrix of rows and columns;

a plurality of word lines respectively provided to rows of said plurality of memory cells; and a plurality of bit line pairs respectively provided to columns of said plurality of memory cells and each including first and second bit lines, wherein each of said plurality of memory cells includes first and second access transistors, having their respective gates connected to a same one of said plurality of word lines, for connecting said first and second bit lines to first and second internal nodes, respectively, a first driver transistor connected between a power-supply node to which an inactivating potential is provided and said first internal node and having a gate connected to said second internal node, and a second driver transistor connected between said power-supply node to which the inactivating potential is provided and said second internal node and having a gate connected to said first internal node, said semiconductor memory device further comprising:

a row select circuit for selecting one of said plurality of word lines according to a row address signal and for providing an activating potential to a selected word line and providing an inactivating potential to unselected word lines when making an access to said memory array, and for providing to said plurality of word lines an intermediate potential between said activating potential and said inactivating potential when the access to said memory array is completed; and a precharging circuit for precharging said plurality of bit lines after the access to said memory array is completed.

2. The semiconductor memory device according to claim 1, wherein said first and second access transistors are field-effect transistors with their respective back gates connected to said first and second internal nodes.

3. The semiconductor memory device according to claim 2, wherein said first access transistor is formed within a first well formed on said main surface, said first well is electrically connected to said first internal node, said second access transistor is formed within a second well formed on said main surface, and said second well is electrically connected to said second internal node.

4. The semiconductor memory device according to claim 2, wherein said first access transistor includes a first source region formed on an insulating film formed on said main surface, a first drain region formed on said insulating film, and a first body region formed on said insulating film and contacting both said first source region and said first drain region, said first body region being connected to said first internal node, and wherein said second access transistor includes a second source region formed on said insulating film, a second drain region formed on said insulating film, and a second body region formed on said insulating film and contacting both said second source region and said second drain region, said second body region being connected to said second internal node.

5. The semiconductor memory device according to claim 2, further comprising an internal dock generating circuit for generating a clock pulse that defines an activation time during which one of said plurality of word lines is activated when making the access to said memory array, wherein said row select circuit selects one of said plurality of word lines according to said clock pulse, and wherein said activation time is a period of time during which a potential change, from a precharge voltage, generated on each of said plurality of bit line pairs is not greater than a flat band voltage of a PN junction when data is read from one of said plurality of memory cells.

6. The semiconductor memory device according to claim 5, wherein the PN junction is between the back gate and an impurity region of said first access transistor in one of said plurality of word lines that is unselected, the impurity region connected to one line of each bit line pairs.

7. The semiconductor memory device according to claim 2, wherein said first driver transistor is a field-effect transistor with a back gate connected to said second internal node, and said second driver transistor is a field-effect transistor with a back gate connected to said first internal node.

8. The semiconductor memory device according to claim 7, wherein said first access transistor and said second driver transistor are formed within a first well provided on said main surface, and said second access transistor and said first driver transistor are formed within a second well provided on said main surface.

9. The semiconductor memory device according to claim 7, wherein a potential difference between said activating potential and said inactivating potential is not greater than a flat band voltage of a PN junction.

10. The semiconductor memory device according to claim 9, wherein said first access transistor and said second driver transistor are formed within a first well provided on said main surface, and said second access transistor and said first driver transistor are formed within a second well provided on said main surface.

11. The semiconductor memory device according to claim 9, wherein the PN junction is the one between an impurity region and the back gate of each of said first and second driver transistors.

12. The semiconductor memory device according to claim 1, wherein said first and second access transistors are field-effect transistors, and said intermediate potential is a potential that has shifted by an amount of a threshold voltage of said field-effect transistor from said inactivating potential toward said activating potential.

13. The semiconductor memory device according to claim 1, wherein
the access to said memory array is made where an operation of selecting one of said plurality of word lines becomes one cycle, and
said precharging circuit precharges said plurality of bit line pairs every said one cycle.

14. The semiconductor memory device according to claim 1, wherein
each of said plurality of memory cells further includes
a first capacitor having one end connected to said first internal node and other end coupled to a first constant potential, and
a second capacitor having one end connected to said second internal node and other end coupled to a second constant potential.

* * * * *